(12) United States Patent
Shimizu et al.

(10) Patent No.: US 10,116,213 B2
(45) Date of Patent: Oct. 30, 2018

(54) SEMICONDUCTOR MODULE AND ELECTRIC POWER CONVERSION APPARATUS

(71) Applicant: DENSO CORPORATION, Kariya, Aichi-pref. (JP)

(72) Inventors: Hiroshi Shimizu, Kariya (JP); Mitsunori Kimura, Kariya (JP); Kengo Mochiki, Kariya (JP); Yuu Yamahira, Kariya (JP); Tetsuya Matsuoka, Kariya (JP); Kazuma Fukushima, Kariya (JP); Yasuyuki Ohkouchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/491,307

(22) Filed: Apr. 19, 2017

(65) Prior Publication Data

US 2017/0302182 A1 Oct. 19, 2017

(30) Foreign Application Priority Data

Apr. 19, 2016 (JP) .................... 2016-084052

(51) Int. Cl.
| | |
|---|---|
| H01L 27/15 | (2006.01) |
| H02M 3/158 | (2006.01) |
| H01L 25/07 | (2006.01) |
| H01L 29/16 | (2006.01) |
| H01L 29/20 | (2006.01) |
| H01L 29/739 | (2006.01) |
| H01L 29/861 | (2006.01) |

(52) U.S. Cl.
CPC ............ *H02M 3/158* (2013.01); *H01L 25/07* (2013.01); *H01L 29/1608* (2013.01); *H01L 29/2003* (2013.01); *H01L 29/7393* (2013.01); *H01L 29/861* (2013.01)

(58) Field of Classification Search
CPC .... H02M 3/158; H01L 29/20; H01L 29/7395; H01L 29/1608; H01L 29/16
USPC ......... 257/77, 76, E29.89, 140, 79; 363/131, 363/132; 327/375, 419, 432; 323/224
See application file for complete search history.

(56) References Cited

U.S. PATENT DOCUMENTS

| | | | | |
|---|---|---|---|---|
| 5,661,644 A | * | 8/1997 | Bergman | H02M 7/003 257/77 |
| 6,753,674 B2 | * | 6/2004 | Grundl | H02M 7/003 323/224 |
| 2013/0062626 A1 | * | 3/2013 | Takao | H03K 17/127 257/77 |

FOREIGN PATENT DOCUMENTS

| | | |
|---|---|---|
| JP | 2013-59190 A | 3/2013 |
| JP | 2014-229642 A | 12/2014 |

\* cited by examiner

*Primary Examiner* — Rajnikant Patel
(74) *Attorney, Agent, or Firm* — Oliff PLC

(57) ABSTRACT

A semiconductor module includes an IGBT and a MOSFET. The IGBT is made of a silicon semiconductor. The MOSFET is made of a wide-bandgap semiconductor having a wider bandgap than the silicon semiconductor. The IGBT and the MOSFET are connected in parallel to each other to form a semiconductor element pair. The IGBT has a greater surface area than the MOSFET. The semiconductor module is configured to operate in a region that includes a low-current region and a high-current region. Electric current flowing through the semiconductor element pair is higher in the high-current region than in the low-current region. In the low-current region, the on-resistance of the MOSFET is lower than the on-resistance of the IGBT. In contrast, in the high-current region, the on-resistance of the IGBT is lower than the on-resistance of the MOSFET.

7 Claims, 15 Drawing Sheets

SEMICONDUCTOR MODULE AND ELECTRIC POWER CONVERSION APPARATUS

CROSS-REFERENCE TO RELATED APPLICATION

This application is based on and claims priority from Japanese Patent Application No. 2016-84052 filed on Apr. 19, 2016, the content of which is hereby incorporated by reference in its entirety into this application.

BACKGROUND

1 Technical Field

The present invention relates to semiconductor modules that have semiconductor elements built therein and electric power conversion apparatuses that employ the semiconductor modules.

2 Description of Related Art

There are known semiconductor modules that are employed in electric power conversion apparatuses (see, for example, Japanese Patent Application Publication No. JP2014229642A). The semiconductor modules have, for example, an IGBT (Insulated-Gate Bipolar Transistor) built therein; the IGBT is made of a silicon semiconductor. The electric power conversion apparatuses are configured to perform electric power conversion by controlling switching of the IGBT.

In recent years, there has been growing demand for low-loss semiconductor modules. In an attempt to meet this demand, a semiconductor module has been investigated where an IGBT made of a silicon semiconductor and a MOSFET (Metal-Oxide-Semiconductor Field-Effect Transistor) made of a wide-bandgap semiconductor (e.g., SiC or GaN) are connected in parallel to each other. The IGBT has, due to the existence of a diffusion potential therein, a high on-resistance in a relatively low-current region. In contrast, the MOSFET made of the wide-bandgap semiconductor has a low on-resistance because there is no diffusion potential in the MOSFET. Therefore, with the IGBT and the MOSFET connected in parallel to each other, it may be possible to reduce the loss of the semiconductor module. Moreover, it may be possible to further reduce the loss of the semiconductor module by increasing the chip area (or surface area) of the MOSFET.

However, the manufacturing cost of a wide-bandgap semiconductor is high. Therefore, increasing the chip area of the MOSFET, the manufacturing cost of the entire semiconductor module is accordingly increased. Moreover, in a high-current region, the bipolar effect of the IGBT becomes remarkable, lowering the on-resistance of the IGBT. Therefore, in the high-current region, the effect of connecting the MOSFET in parallel to the IGBT on reduction of the loss of the semiconductor module becomes small. Accordingly, in the high-current region, it is difficult to considerably reduce the loss of the semiconductor module by increasing the chip area of the MOSFET.

SUMMARY

According to exemplary embodiments, there is provided a semiconductor module which includes an IGBT and a MOSFET. The IGBT is made of a silicon semiconductor. The MOSFET is made of a wide-bandgap semiconductor having a wider bandgap than the silicon semiconductor. The IGBT and the MOSFET are connected in parallel to each other to form a semiconductor element pair. The IGBT has a greater surface area than the MOSFET. The semiconductor module is configured to operate in a region that includes a low-current region and a high-current region. Electric current flowing through the semiconductor element pair is higher in the high-current region than in the low-current region. In the low-current region, the on-resistance of the MOSFET is lower than the on-resistance of the IGBT. In contrast, in the high-current region, the on-resistance of the IGBT is lower than the on-resistance of the MOSFET.

With the above configuration, the surface area of the MOSFET is specified to be less than the surface area of the IGBT. Therefore, it is possible to minimize the surface area of the MOSFET that is made of the wide-bandgap semiconductor whose manufacturing cost is high. Consequently, it is possible to minimize the manufacturing cost of the entire semiconductor module.

Moreover, with the above configuration, in the low-current region, the electric current flows mainly through the MOSFET whose on-resistance is lower than the on-resistance of the IGBT in the low-current region. Consequently, it is possible to reduce the loss of the semiconductor module during its operation in the low-current region. In addition, since the MOSFET is mainly used in the low-current region, it is possible to minimize the surface area of the MOSFET as described above without making it difficult for the low electric current to flow mainly through the MOSFET.

Furthermore, with the above configuration, in the high-current region, the electric current flows mainly through the IGBT whose on-resistance is lower than the on-resistance of the MOSFET in the high-current region. Consequently, it is possible to reduce the loss of the semiconductor module during its operation in the high-current region. In addition, since the surface area of the IGBT is specified to be greater than the surface area of the MOSFET, it is possible to facilitate the flow of the high electric current mainly through the IGBT.

Accordingly, with the above configuration, in each of the low-current region and the high-current region, it is possible to have the electric current flow mainly through that one of the IGBT and the MOSFET whose on-resistance is lower than the other in the region. Consequently, it is possible to reduce the loss of the semiconductor module over the entire operating region.

To sum up, with the above configuration, it is possible to minimize the manufacturing cost of the semiconductor module and reduce the loss of the semiconductor module over the entire operating region.

BRIEF DESCRIPTION OF THE DRAWINGS

The present invention will be understood more fully from the detailed description given hereinafter and from the accompanying drawings of exemplary embodiments, which, however, should not be taken to limit the invention to the specific embodiments but are for the purpose of explanation and understanding only.

In the accompanying drawings.

DESCRIPTION OF EMBODIMENTS

Figure 1:
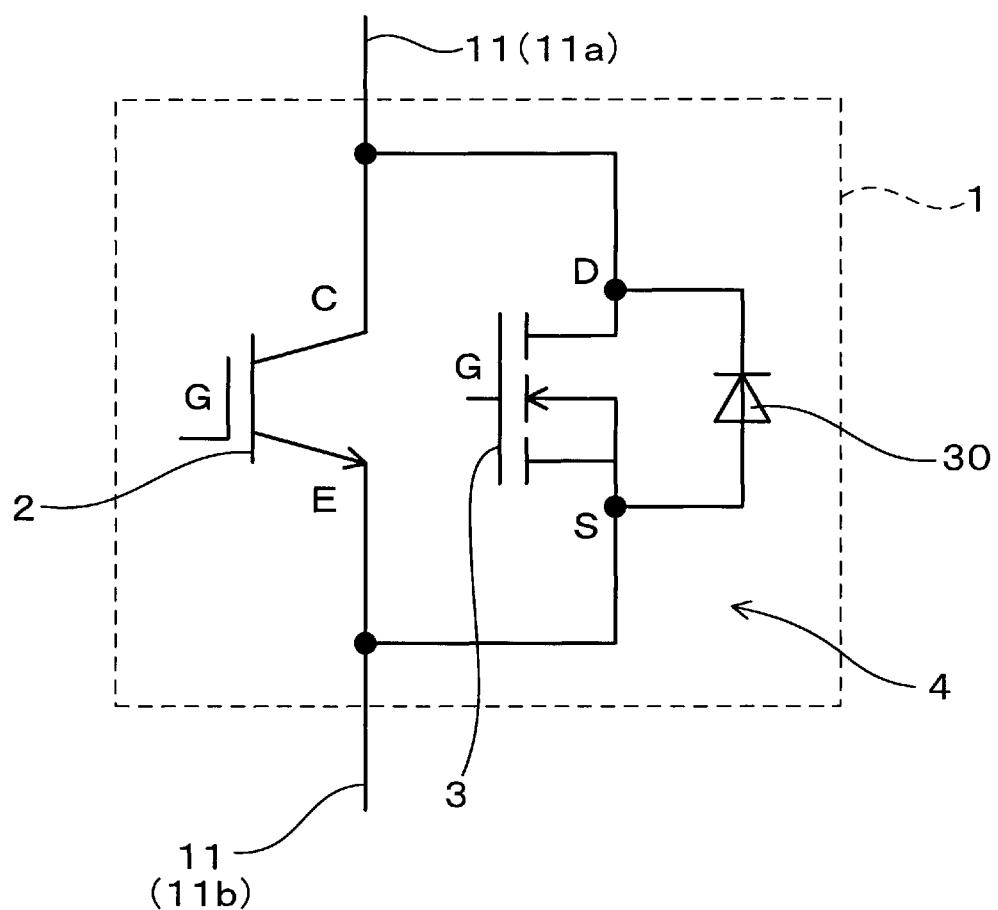
FIG. 1 is a schematic view of a semiconductor module according to a first embodiment.

Exemplary embodiments will be described hereinafter with reference to FIGS. 1-16. It should be noted that for the sake of clarity and understanding, identical components having identical functions throughout the whole description have been marked, where possible, with the same reference numerals in each of the figures and that for the sake of avoiding redundancy, descriptions of identical components will not be repeated.

[First Embodiment]

FIG. 1 shows the configuration of a semiconductor module 1 according to a first embodiment. As shown in the figure, the semiconductor module 1 includes an IGBT (Insulated-Gate Bipolar Transistor) 2 and a MOSFET (Metal-Oxide-Semiconductor Field-Effect Transistor) 3.

In the present embodiment, the IGBT 2 is made of a silicon semiconductor. The MOSFET 3 is made of a wide-bandgap semiconductor having a wider bandgap than the silicon semiconductor. More particularly, in the present embodiment, the MOSFET 3 is made of SiC.

As shown in FIG. 1, in the present embodiment, the IGBT 2 and the MOSFET 3 are connected in parallel to each other to form a semiconductor element pair 4. Moreover, as shown in FIG. 2, the IGBT 2 has a greater surface area than the MOSFET 3.

Figure 3:
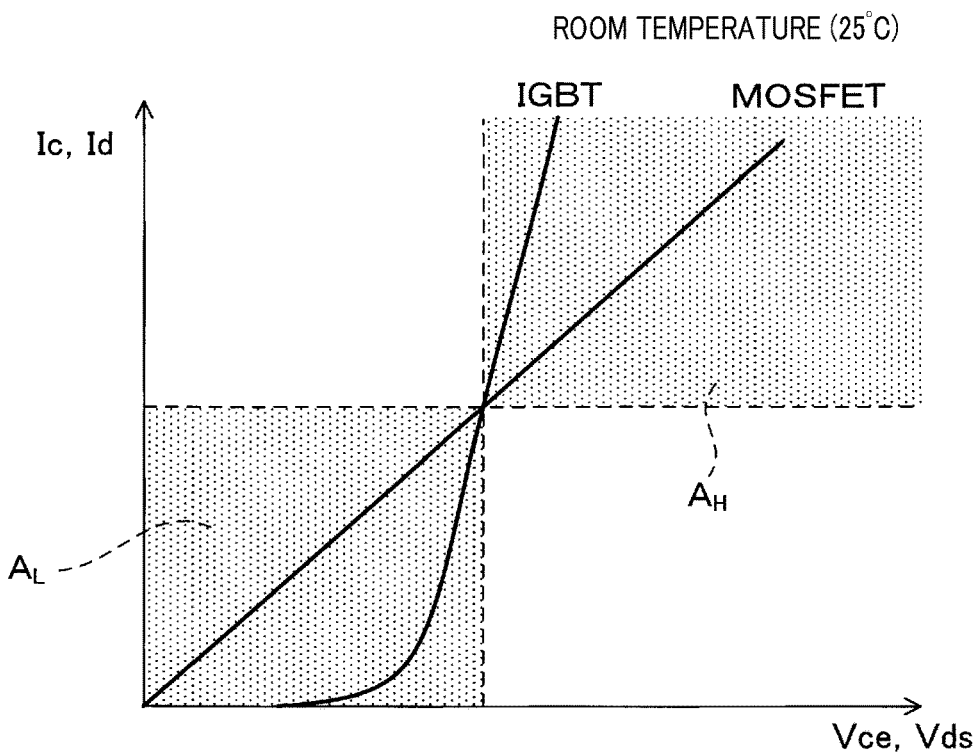
FIG. 3 is a graph showing the current-voltage characteristics of the IGBT and the MOSFET of the semiconductor module according to the first embodiment at room temperature.

As shown in FIG. 3, in the present embodiment, the semiconductor module 1 is configured to operate in a region which includes a low-current region $A_L$ and a high-current region $A_H$. Electric current flowing through the semiconductor element pair 4 is higher in the high-current region $A_H$ than in the low-current region $A_L$. Moreover, in the low-current region $A_L$, the on-resistance of the MOSFET 3 is lower than the on-resistance of the IGBT 2. In contrast, in the high-current region $A_H$, the on-resistance of the IGBT 2 is lower than the on-resistance of the MOSFET 3.

Figure 6:
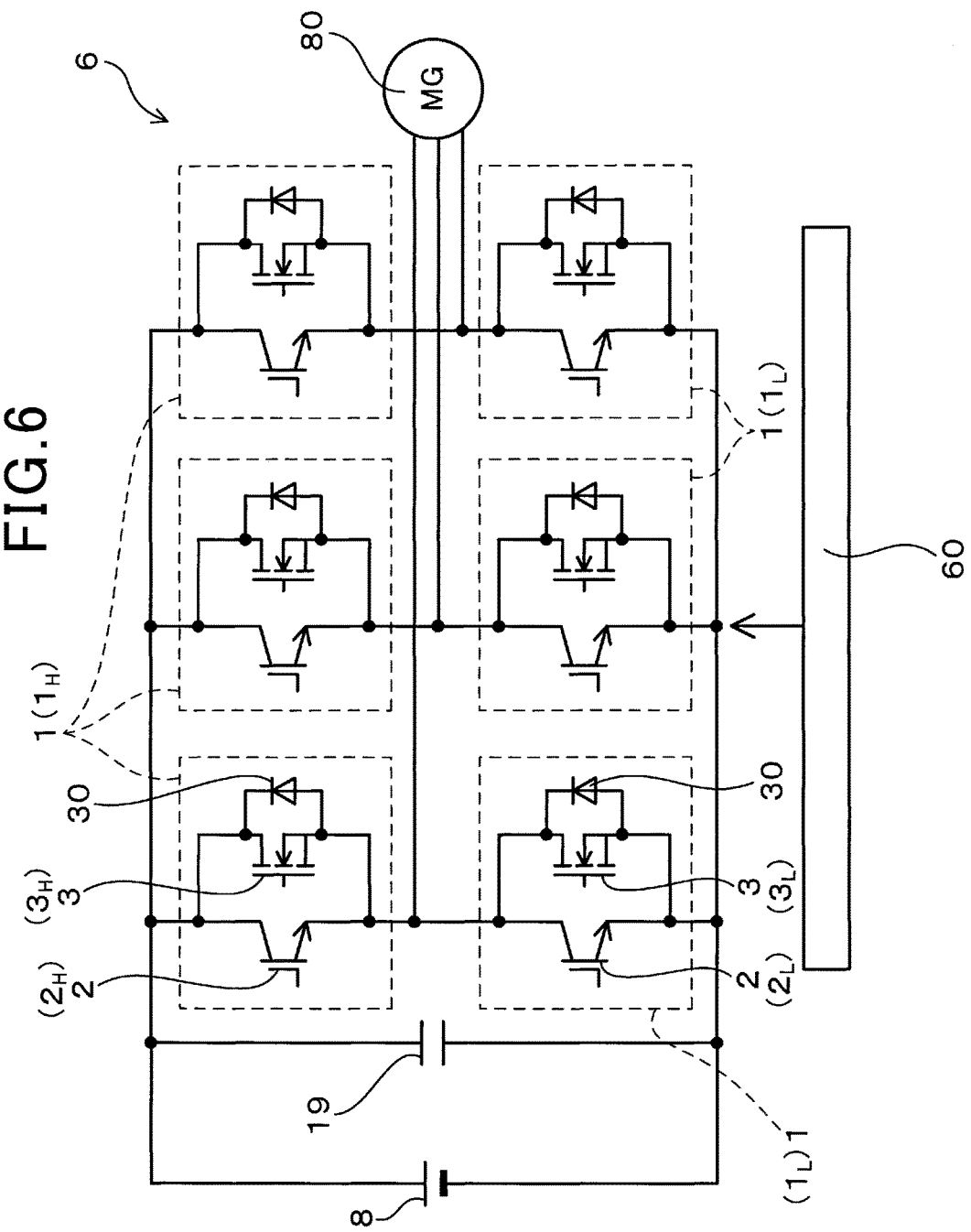
FIG. 6 is a circuit diagram of an electric power conversion apparatus according to the first embodiment.

The semiconductor module 1 according to the present embodiment is employed in an electric power conversion apparatus 6 as shown in FIG. 6. The electric power conversion apparatus 6 is a vehicular electric power converter for use in a motor vehicle such as a hybrid vehicle or an electric vehicle.

Figure 2:
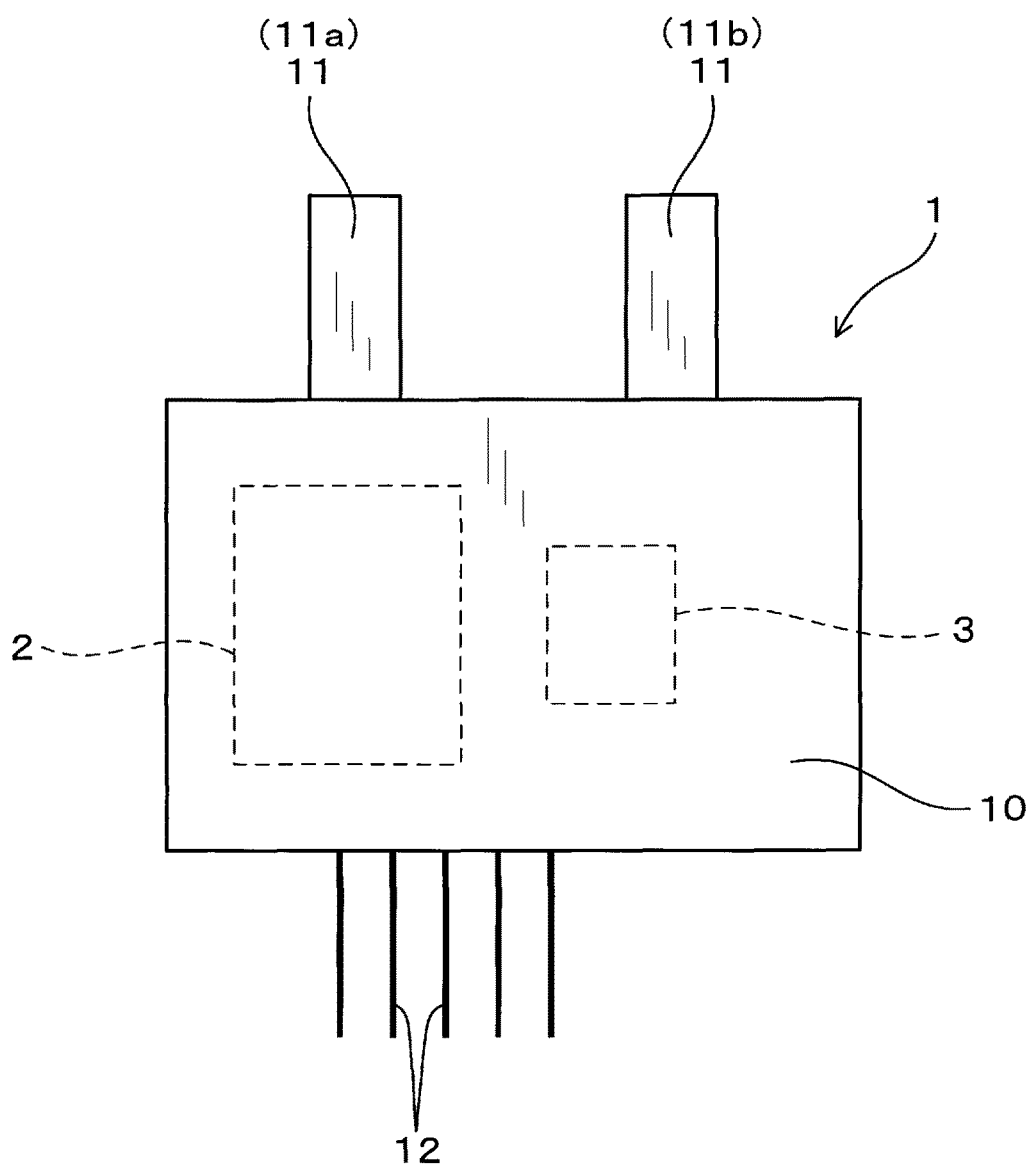
FIG. 2 is a plan view of the semiconductor module according to the first embodiment, wherein an IGBT and a MOSFET, both of which are built in the semiconductor module, are shown with dashed lines.

As shown in FIG. 2, in the present embodiment, the semiconductor module 1 includes a main body 10 that has the IGBT 2 and the MOSFET 3 built therein, a pair of power terminals 11 (11a, 11b) protruding from the main body 10, and a plurality of control terminals 12.

As shown in FIG. 1, of the pair of power terminals 11, one power terminal 11a is connected to both a collector (C) of the IGBT 2 and a drain (D) of the MOSFET 3, while the other power terminal 11b is connected to both an emitter (E) of the IGBT 2 and a source (S) of the MOSFET 3. Moreover, though not shown in FIG. 1, some of the control terminals 12 are connected to a gate (G) of the IGBT 2 and a gate (G) of the MOSFET 3, so that voltages can be applied to the gates (G) of the IGBT 2 and the MOSFET 3 via these control terminals 12.

FIG. 3 shows the current-voltage characteristics of the IGBT 2 and the MOSFET 3 at room temperature (e.g., 25° C.).

Here, the current-voltage characteristics of the IGBT 2 are determined by investigating the relationship between the voltage Vce applied between the collector and the emitter of the IGBT 2 and the collector current Ic flowing between the collector and the emitter of the IGBT 2 with a constant voltage applied to the gate of the IGBT 2. On the other hand, the current-voltage characteristics of the MOSFET 3 are determined by investigating the relationship between the voltage Vds applied between the drain and the source of the MOSFET 3 and the drain current Id flowing between the drain and the source of the MOSFET 3 with a constant voltage applied to the gate of the MOSFET 3.

As seen from FIG. 3, in the MOSFET 3, with increase in the voltage Vds applied between the drain and the source, the drain current Id increases at a constant slope. That is to say, the on-resistance of the MOSFET 3 is constant regardless of the voltage Vds (or regardless of the drain current Id).

On the other hand, in the IGBT 2, upon the voltage Vce applied between the collector and the emitter reaching a certain level, the collector current Ic increases sharply. That is to say, the on-resistance of the IGBT 2 is not constant but decreases sharply upon the voltage Vce reaching a certain level.

Accordingly, in the present embodiment, in the low-current region $A_L$ where the electric current flowing through the entire semiconductor module 1 is relatively low, the on-resistance of the MOSFET 3 is lower than the on-resistance of the IGBT 2. In contrast, in the high-current region $A_H$ where the electric current flowing through the entire semiconductor module 1 is relatively high, the on-resistance of the IGBT 2 is lower than the on-resistance of the MOSFET 3.

Figure 4:
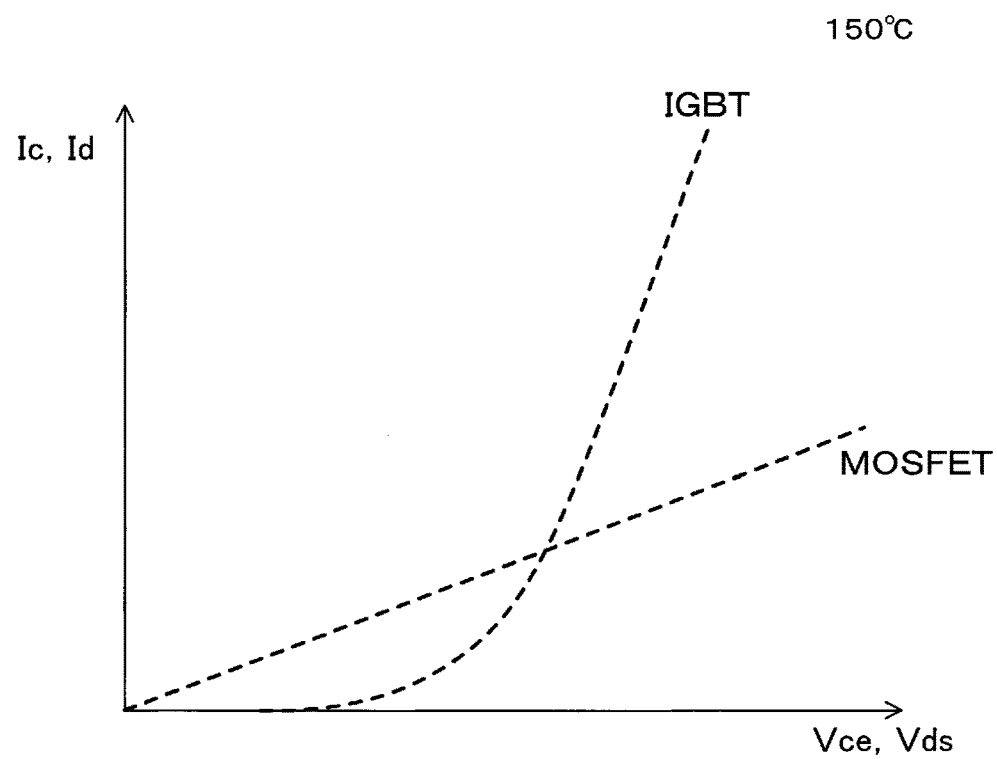
FIG. 4 is a graph showing the current-voltage characteristics of the IGBT and the MOSFET of the semiconductor module according to the first embodiment at high temperature.

Moreover, as shown in FIG. 4, both the on-resistance of the IGBT 2 and the on-resistance of the MOSFET 3 increase with increase in temperature. However, the rate of increase in the on-resistance of the MOSFET 3 is higher than the rate of increase in the on-resistance of the IGBT 2. That is, with increase in temperature, the on-resistance of the MOSFET 3 increases more sharply than the on-resistance of the IGBT 2.

Figure 5:
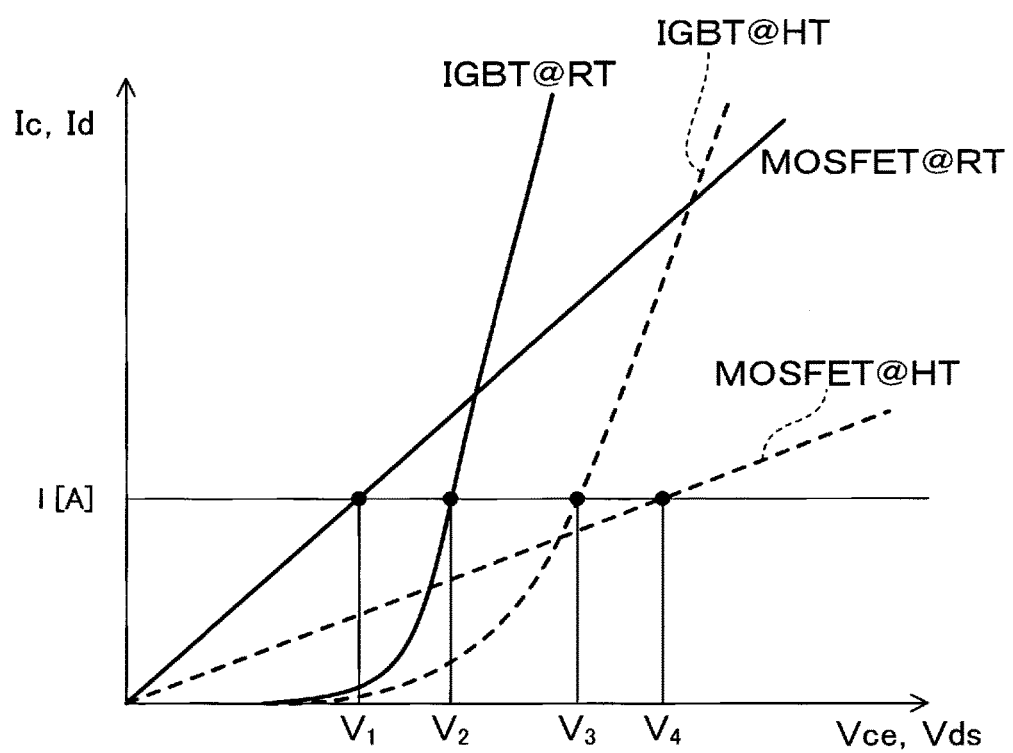
FIG. 5 is a graph obtained by superimposing the graphs of FIGS. 3 and 4.

FIG. 5 shows a graph that is obtained by superimposing the graphs shown in FIGS. 3 and 4.

As seen from FIG. 5, when the semiconductor module 1 operates in the low-current region $A_L$ and the temperature of the semiconductor module 1 is relatively low (e.g., at room temperature of 25° C. as shown in FIG. 3), the on-resistance $R_{IGBTRT}$ of the IGBT 2 and the on-resistance $R_{MOSRT}$ of the MOSFET 3 satisfy the following relationship:

$$R_{MOSRT} < R_{IGBTRT}$$

In contrast, when the semiconductor module 1 operates in the high-current region $A_H$ and the temperature of the semiconductor module 1 has been increased (e.g., to 150° C. as shown in FIG. 4) by heat generated by the operation of the semiconductor module 1, the on-resistance $R_{IGBTHT}$ of the IGBT 2 and the on-resistance $R_{MOSHT}$ of the MOSFET 3 satisfy the following relationship:

$$R_{IGBTHT} < R_{MOSHT}$$

In addition, in FIG. 5, IGBT@RT and MOSFET@RT respectively designate the current-voltage characteristics of the IGBT 2 and the current-voltage characteristics of the MOSFET 3 at room temperature (e.g., 25° C.); and IGBT@HT and MOSFET@HT respectively designate the current-voltage characteristics of the IGBT 2 and the current-voltage characteristics of the MOSFET 3 at high temperature (e.g., 150° C.).

FIG. 6 shows the configuration of the electric power conversion apparatus 6. As shown in the figure, the electric power conversion apparatus 6 includes six semiconductor modules 1 ($1_H$, $1_L$) according to the present embodiment. That is, each of the semiconductor modules 1 includes an IGBT 2 and a MOSFET 3 as described above. Moreover, three of the six semiconductor modules 1 are upper-arm semiconductor modules $1_H$ while the remaining three are lower-arm semiconductor modules $1_L$. In other words, the electric power conversion apparatus 6 includes three pairs of upper-arm semiconductor modules $1_H$ and lower-arm semiconductor modules $1_L$. The electric power conversion apparatus 6 also includes a smoothing capacitor 19 and a control circuit 60. The control circuit 60 controls the switching operation of the IGBTs 2 and the MOSFETs 3 of the semiconductor modules 1, thereby converting DC power from a DC power source 8 (e.g., a vehicular battery) into AC power and supplying the obtained AC power to an AC load 80. In addition, the AC load 80 may be, for example, a motor-generator (MG) for driving the vehicle.

Moreover, as shown in FIG. 6, in each of the MOSFETs 3 of the semiconductor modules 1, there is formed a body diode 30. During the switching operation of the IGBTs 2 and the MOSFETs 3 of the semiconductor modules 1, flyback current generated due to the inductance of the AC load 80 flows through the body diodes 30 of the MOSFETs 3.

According to the present embodiment, it is possible to achieve the following advantageous effects.

In the present embodiment, each semiconductor module 1 includes the IGBT 2 made of the silicon semiconductor and the MOSFET 3 made of the wide-bandgap semiconductor (more particularly, SiC) having a wider bandgap than the silicon semiconductor 2. The IGBT 2 and the MOSFET 3 are connected in parallel to each other to form the semiconductor element pair 4 (see FIG. 1). The surface area of the IGBT 2 is greater than the surface area of the MOSFET 3 (see FIG. 2). The semiconductor module 1 is configured to operate in the region that includes the low-current region $A_L$ and the high-current region $A_H$ (see FIG. 3). The electric current flowing through the semiconductor element pair 4 is higher in the high-current region $A_H$ than in the low-current region $A_L$. In the low-current region $A_L$, the on-resistance of the MOSFET 3 is lower than the on-resistance of the IGBT 2. In contrast, in the high-current region $A_H$, the on-resistance of the IGBT 2 is lower than the on-resistance of the MOSFET 3.

With the above configuration, the surface area of the MOSFET 3 is specified to be less than the surface area of the IGBT 2. Therefore, it is possible to minimize the surface area of the MOSFET 3 that is made of the wide-bandgap semiconductor whose manufacturing cost is high. Consequently, it is possible to minimize the manufacturing cost of the entire semiconductor module 1.

Moreover, with the above configuration, in the low-current region $A_L$, the electric current flows mainly through the MOSFET 3 whose on-resistance is lower than the on-resistance of the IGBT 2 in the low-current region $A_L$. Consequently, it is possible to reduce the loss of the semiconductor module 1 during its operation in the low-current region $A_L$. In addition, since the MOSFET 3 is mainly used in the low-current region $A_L$, it is possible to minimize the surface area of the MOSFET 3 as described above without making it difficult for the low electric current to flow mainly through the MOSFET 3.

Furthermore, with the above configuration, in the high-current region $A_H$, the electric current flows mainly through the IGBT 2 whose on-resistance is lower than the on-resistance of the MOSFET 3 in the high-current region $A_H$. Consequently, it is possible to reduce the loss of the semiconductor module 1 during its operation in the high-current region $A_H$. In addition, since the surface area of the IGBT 2 is specified to be greater than the surface area of the MOSFET 3, it is possible to facilitate the flow of the high electric current mainly through the IGBT 2.

Accordingly, with the above configuration, in each of the low-current region $A_L$ and the high-current region $A_H$, it is possible to have the electric current flow mainly through that one of the IGBT 2 and the MOSFET 3 whose on-resistance is lower than the other in the region. Consequently, it is possible to reduce the loss of the semiconductor module 1 over the entire operating region.

Moreover, in the present embodiment, when the semiconductor module 1 operates in the low-current region $A_L$ and the temperature of the semiconductor module 1 is equal to a first temperature (e.g., room temperature of 25° C. as shown in FIG. 3), the on-resistance $R_{IGBTRT}$ of the IGBT 2 and the on-resistance $R_{MOSRT}$ of the MOSFET 3 satisfy the relationship of $R_{MOSRT}<R_{IGBTRT}$. In contrast, when the semiconductor module 1 operates in the high-current region $A_H$ and the temperature of the semiconductor module 1 has been increased, by heat generated by the operation of the semiconductor module 1, to a second temperature (e.g., 150° C. as shown in FIG. 4) that is higher than the first temperature, the on-resistance $R_{IGBTHT}$ of the IGBT 2 and the on-resistance $R_{MOSHT}$ of the MOSFET 3 satisfy the relationship of $R_{IGBTHT}<R_{MOSHT}$.

With the above configuration, the on-resistance of the MOSFET 3 increases more sharply than the on-resistance of the IGBT 2 with increase in the temperature of the semiconductor module 1. Therefore, when the semiconductor module 1 operates in the high-current region $A_H$ and the temperature of the semiconductor module 1 has been increased by heat generated by the operation of the semiconductor module 1, the main path of the electric current is shifted from the MOSFET 3 to the IGBT 2. In the present embodiment, as described above, the surface area of the IGBT 2 is specified to be greater than the surface area of the MOSFET 3. Consequently, during the operation of the semiconductor module 1 in the high-current region $A_H$, it is possible to facilitate the flow of the high electric current mainly through the IGBT 2, thereby keeping the loss of the semiconductor module 1 low even when the temperature of the semiconductor module 1 becomes high.

To sum up, the semiconductor module 1 according to the present embodiment has the above-described configuration with which it is possible minimize the manufacturing cost and reduce the loss of the semiconductor module 1 over the entire operating region.

In addition, in the present embodiment, as described above, the MOSFET 3 is made of SiC. However, the MOSFET 3 may also be made of other wide-bandgap semiconductors, such as GaN or diamond.

Figure 7:
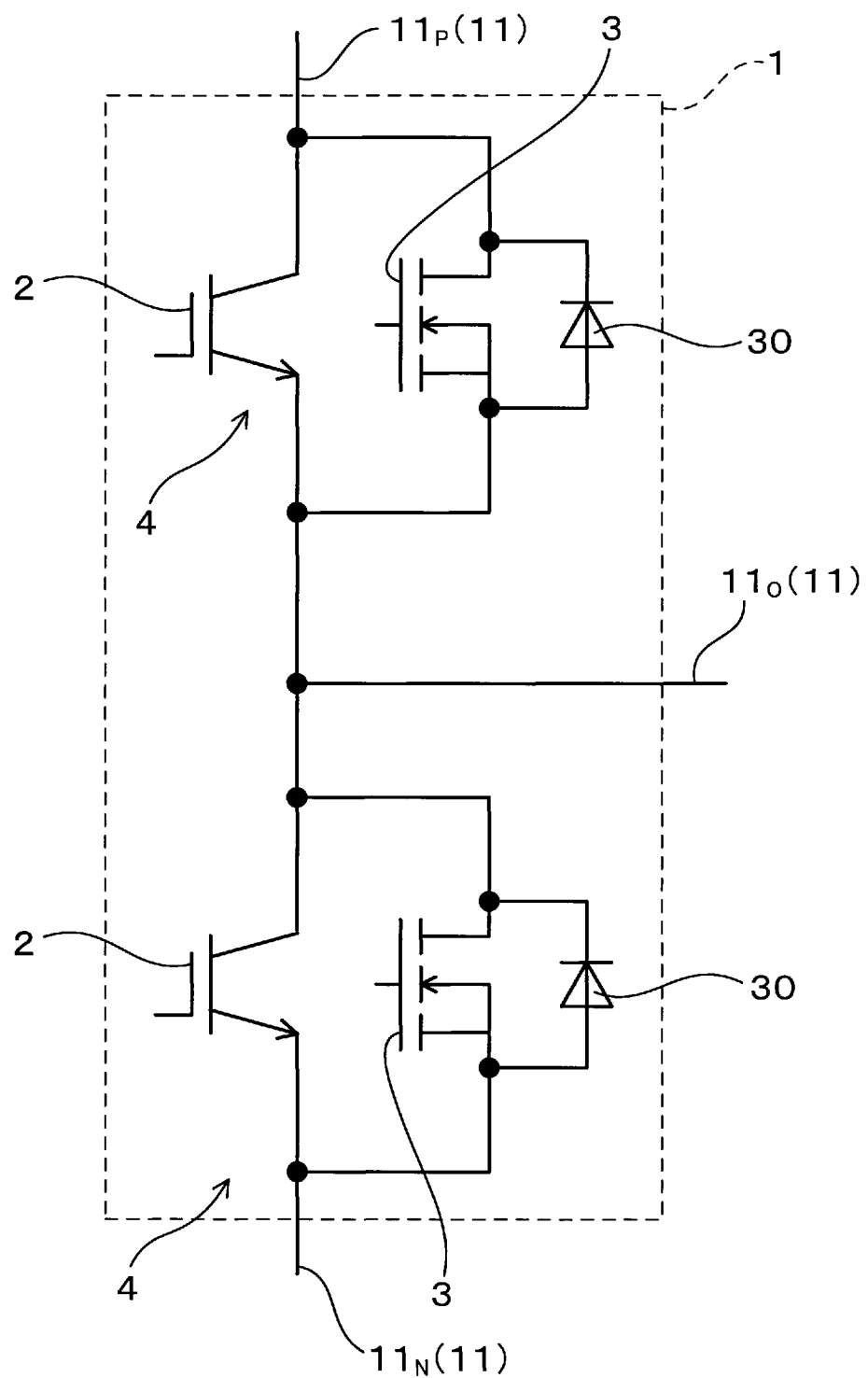
FIG. 7 is a schematic view of a semiconductor module according to a modification of the first embodiment.

Moreover, in the present embodiment, as described above, the semiconductor module 1 has only one semiconductor element pair 4 built therein (see FIG. 1). However, as shown in FIG. 7, the semiconductor module 1 may be modified to have both an upper-arm semiconductor element pair 4 and a lower-arm semiconductor element pair 4 built therein; each of the upper-arm and lower-arm semiconductor element pairs 4 consists of an IGBT 2 and a MOSFET 3 that are connected in parallel to each other.

[Second Embodiment]

Figure 8:
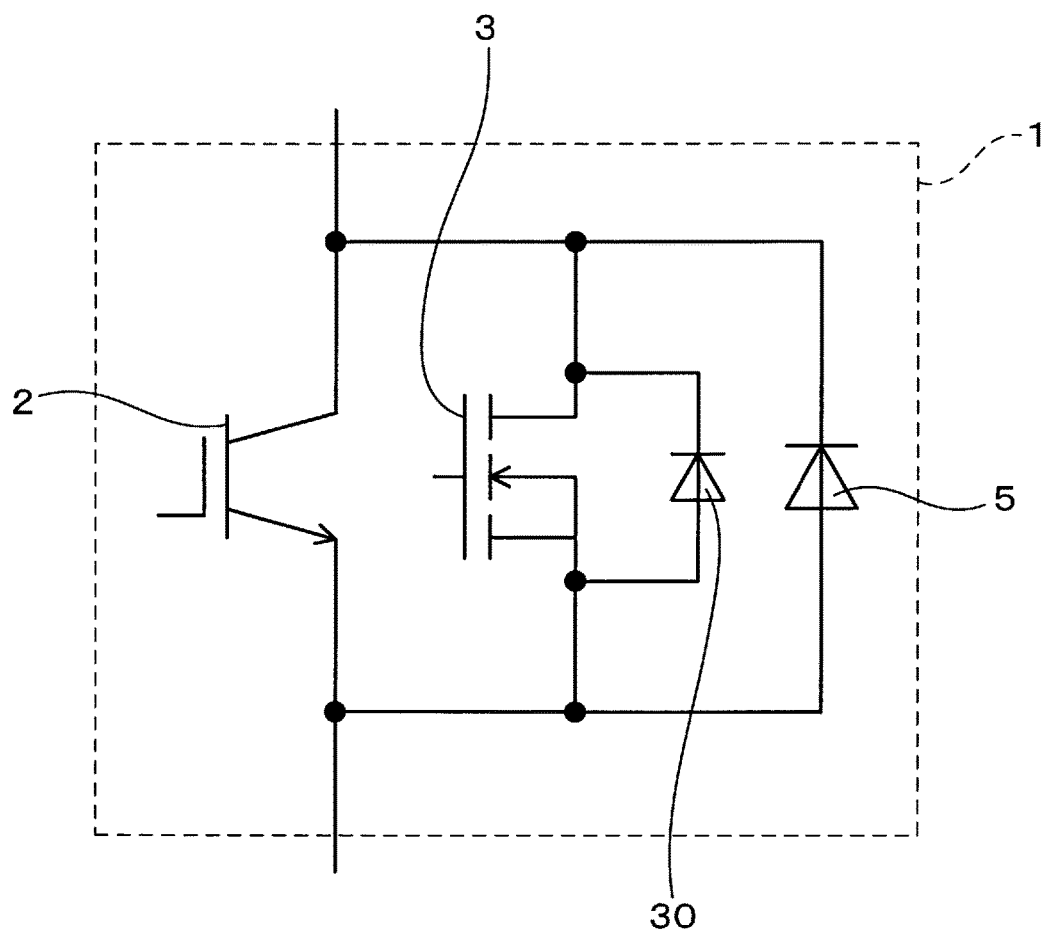
FIG. 8 is a schematic view of a semiconductor module according to a second embodiment.

FIG. 8 shows the configuration of a semiconductor module 1 according to a second embodiment.

Compared to the semiconductor modules 1 according to the first embodiment (see FIG. 1), the semiconductor module 1 according to the present embodiment further includes, as shown in FIG. 8, a diode 5 that is connected in antiparallel (or inverse parallel) to the MOSFET 3. The diode 5 is a Schottky barrier diode made of a wide-bandgap semiconductor such as SiC.

Figure 9:
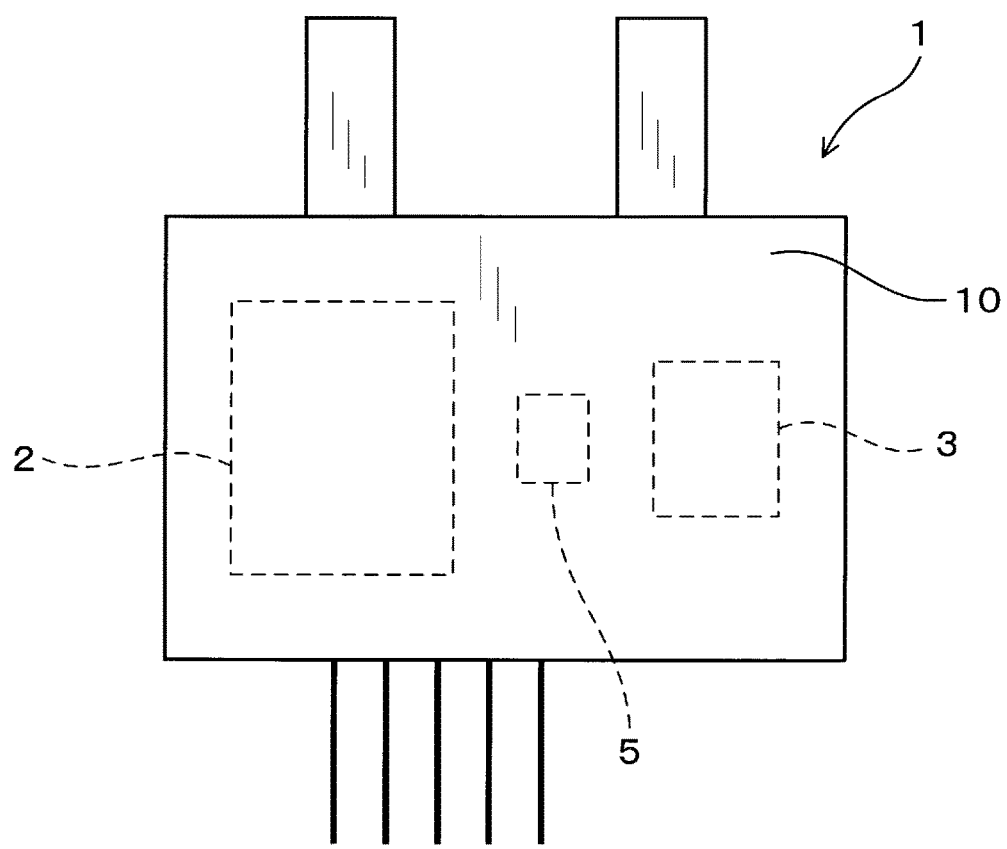
FIG. 9 is a plan view of the semiconductor module according to the second embodiment, wherein an IGBT, a MOSFET and a diode, all of which are built in the semiconductor module, are shown with dashed lines.

As shown in FIG. 9, in the present embodiment, the surface area $S_{IGBT}$ of the IGBT 2, the surface area $S_{MOS}$ of the MOSFET 3 and the surface area $S_{DI}$ of the diode 5 are set to satisfy the following relationship:

$$S_{IGBT}>S_{MOS}>S_{DI}$$

Similar to the electric power conversion apparatus 6 according to the first embodiment (see FIG. 6), an electric power conversion apparatus 6 according to the present embodiment includes six semiconductor modules 1 ($1_H$, $1_L$) according to the present embodiment. Moreover, three of the six semiconductor modules 1 are upper-arm semiconductor modules $1_H$ while the remaining three are lower-arm semiconductor modules $1_L$. In other words, the electric power conversion apparatus 6 includes three pairs of upper-arm semiconductor modules $1_H$ and lower-arm semiconductor modules $1_L$.

Figure 11:
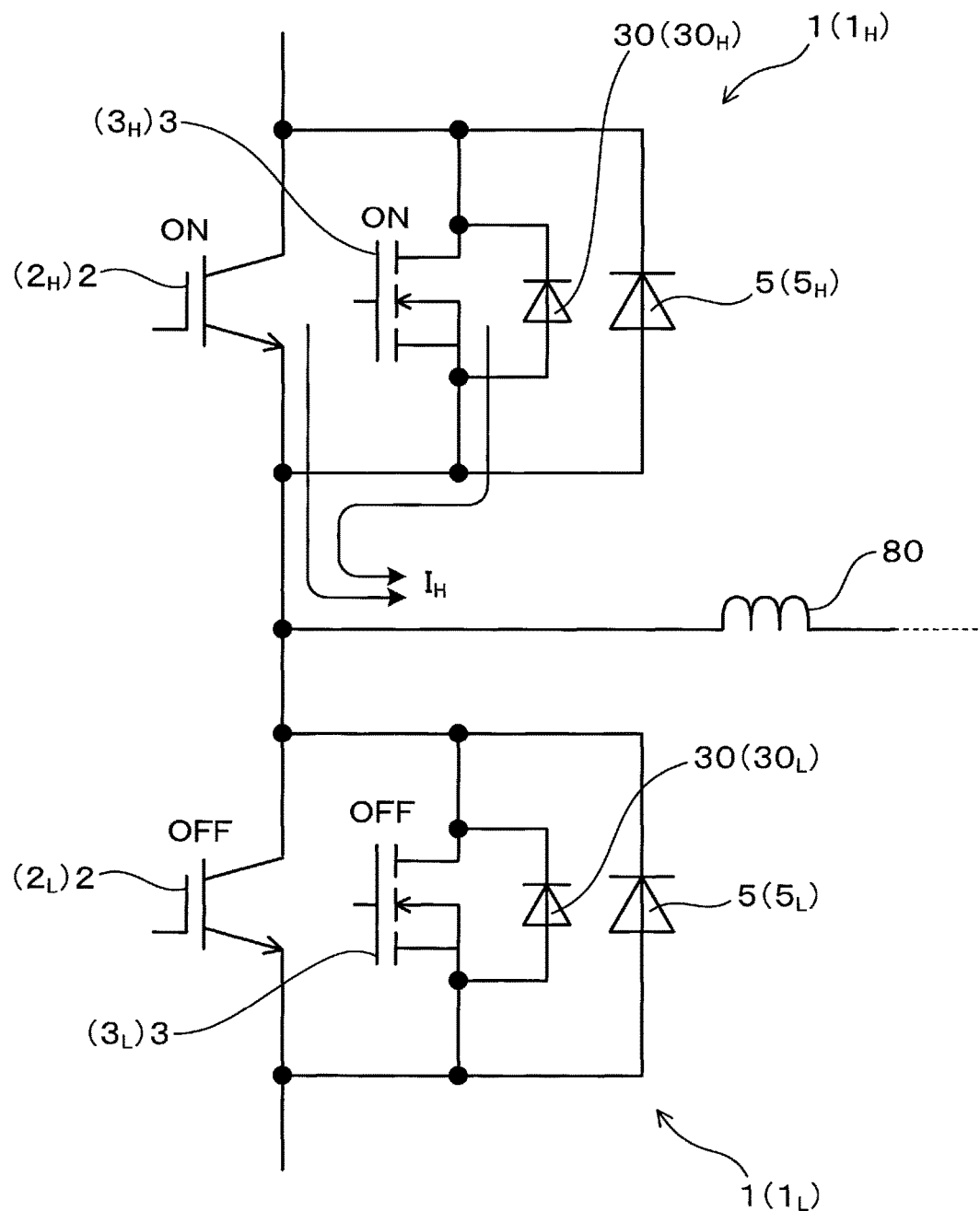
FIG. 11 is a schematic view illustrating the electric current flow in the pair of upper-arm and lower-arm semiconductor modules of the electric power conversion apparatus according to the second embodiment when both the IGBT and the MOSFET of the upper-arm semiconductor module are in an on-state.
Figure 12:
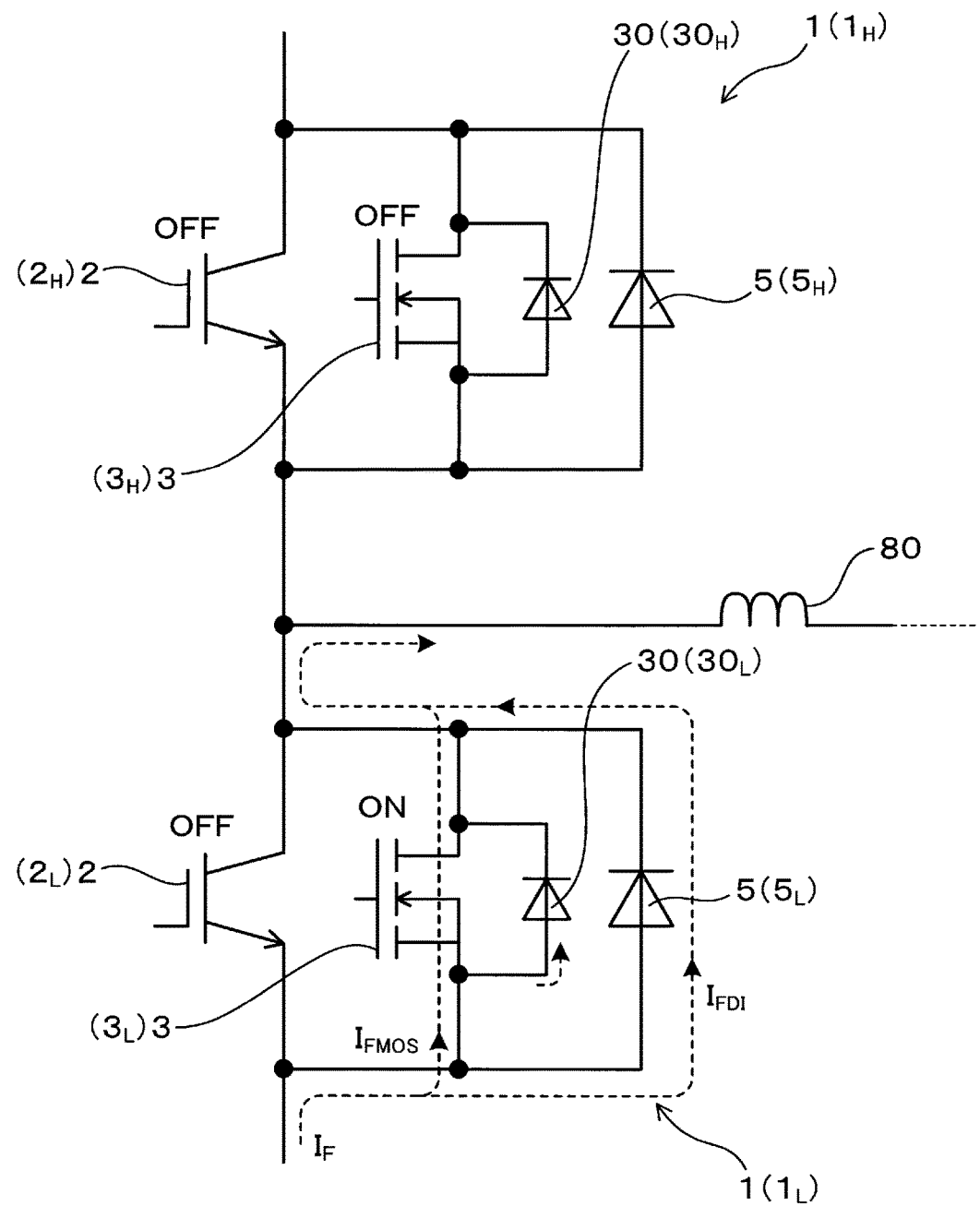
FIG. 12 is a schematic view illustrating the electric current flow in the pair of upper-arm and lower-arm semiconductor modules of the electric power conversion apparatus according to the second embodiment when both the IGBT and the MOSFET of the upper-arm semiconductor module are turned from on to off.

FIGS. 11 and 12 illustrate the electric current flow in one pair of upper-arm and lower-arm semiconductor modules $1_H$ and $1_L$ in the electric power conversion apparatus 6 according to the present embodiment.

As shown in FIG. 11, when both the IGBT $2_H$ and the MOSFET $3_H$ of the upper-arm semiconductor module $1_H$ are in an on-state, electric current $I_H$ flows through both the IGBT $2_H$ and the MOSFET $3_H$ to the AC load 80.

Then, as shown in FIG. 12, when both the IGBT $2_H$ and the MOSFET $3_H$ of the upper-arm semiconductor module $1_H$ are turned from on to off, flyback current $I_F$ generated due to the inductance of the AC load 80 flows through the diode $5_L$ of the lower-arm semiconductor module $1_L$. At the same time, a slight amount of the flyback current $I_F$ flows through the body diode $30_L$ of the MOSFET $3_L$ of the lower-arm semiconductor module $1_L$.

In the present embodiment, when the flyback current $I_F$ flows through the lower-arm semiconductor module $1_L$, the MOSFET $3_L$ of the lower-arm semiconductor module $1_L$ is turned on, thereby allowing the flyback current $I_F$ to flow through the MOSFET $3_L$.

Figure 10:
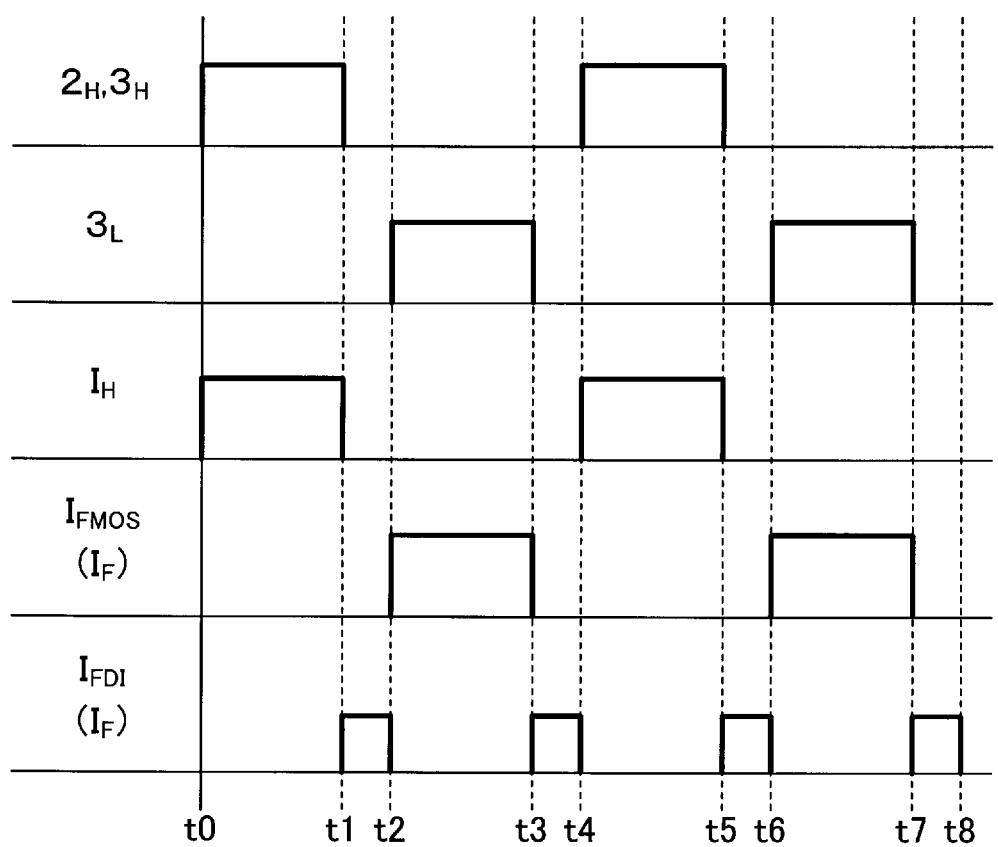
FIG. 10 is a time chart illustrating the switching operation of a pair of upper-arm and lower-arm semiconductor modules of an electric power conversion apparatus according to the second embodiment.

FIG. 10 illustrates the switching operation of the pair of upper-arm and lower-arm semiconductor modules $1_H$ and $1_L$ according to the present embodiment.

As shown in FIG. 10, both the IGBT $2_H$ and the MOSFET $3_H$ of the upper-arm semiconductor module $1_H$ are turned on at a time instant t0 and kept on until a time instant t1. During the duration of t0-t1, the electric current $I_H$ flows through both the IGBT $2_H$ and the MOSFET $3_H$ to the AC load 80. Then, at the time instant t1, both the IGBT $2_H$ and the MOSFET $3_H$ of the upper-arm semiconductor module $1_H$ are turned from on to off After the elapse of a predetermined time from the time instant t1, the MOSFET $3_L$ of the lower-arm semiconductor module $1_L$ is turned on at a time instant t2. During the duration of t1-t2, the flyback current $I_{FDI}$ ($I_F$) flows through the diode $5_L$ of the lower-arm semiconductor module $1_L$. Then, the MOSFET $3_L$ is kept on until it is turned off at a time instant t3. During the duration of t2-t3, the flyback current $I_{FMOS}$ ($I_F$) flows through the MOSFET $3_L$. Moreover, after the elapse of a predetermined time from the time instant t3, both the IGBT $2_H$ and the MOSFET $3_H$ of the upper-arm semiconductor module $1_H$ are again turned on at a time instant t4. During the duration of t3-t4, the flyback current $I_{FDI}$ ($I_F$) flows through the diode $5_L$ of the lower-arm semiconductor module $1_L$. Then, both the IGBT $2_H$ and the MOSFET $3_H$ are kept on until they are again turned off at a time instant t5. During the duration of t4-t5, the electric current $I_H$ flows through both the IGBT $2_H$ and the MOSFET $3_H$ to the AC load 80. In the above manner, the switching operation of the pair of upper-arm and lower-arm semiconductor modules $1_H$ and $1_L$ is repeated. In addition, the switching operation is controlled by a control circuit 60 of the electric power conversion apparatus 6 (see FIG. 6).

As described above, during the durations (or dead times) of t1-t2 and t3-t4, the flyback current $I_F$ flows mainly through the diode $5_L$ of the lower-arm semiconductor module $1_L$. In contrast, during the duration of t2-t3, the MOSFET $3_L$ of the lower-arm semiconductor module $1_L$ is kept on so that the flyback current $I_F$ flows mainly through the MOSFET $3_L$ whose on-resistance is lower than the on-resistance of the diode $5_L$.

According to the present embodiment, it is possible to achieve the same advantageous effects as described in the first embodiment.

Moreover, in the present embodiment, each semiconductor module 1 further includes, in addition to the IGBT 2 and the MOSFET 3, the diode 5 that is connected in antiparallel to the MOSFET 3. Consequently, it is possible for an increased amount of the flyback current $I_F$ to flow through the semiconductor module 1 without incurring a large loss.

More specifically, the amount of electric current allowed to flow through the body diode 30 of the MOSFET 3 of the semiconductor module 1 is small. Therefore, without the diode 5 connected in antiparallel to the MOSFET 3, when the flyback current $I_F$ flowing through the semiconductor module 1 is high, a large loss would occur due to the high resistance of the semiconductor module 1 to the flyback current $I_F$. In contrast, in the present embodiment, with the diode 5 connected in antiparallel to the MOSFET 3, the resistance of the semiconductor module 1 to the flyback current $I_F$ is considerably lowered. Therefore, even when the flyback current $I_F$ flowing through the semiconductor module 1 is high, it is still possible to suppress a large loss from occurring in the semiconductor module 1.

In the present embodiment, the diode 5 is implemented by a Schottky barrier diode made of a wide-bandgap semiconductor. In a Schottky barrier diode, there is no recovery current flowing. Therefore, implementing the diode 5 with a Schottky barrier diode, it is possible to eliminate the recovery loss of the diode 5.

In the present embodiment, the surface area $S_{IGBT}$ of the IGBT 2, the surface area $S_{MOS}$ of the MOSFET 3 and the surface area $S_{DI}$ of the diode 5 are set to satisfy the relationship of $S_{IGBT} > S_{MOS} > S_{DI}$. Therefore, it is possible to minimize the surface area $S_{DI}$ of the diode 5, thereby minimizing the manufacturing cost of the entire semiconductor module 1. Moreover, in this case, the flyback current $I_F$ flows mainly through the MOSFET 3 whose on-resistance is lower than the on-resistance of the diode 5. Consequently, it is possible to reduce the loss that occurs in the semiconductor module 1 during the flow of the flyback current $I_F$ through the semiconductor module 1.

In the present embodiment, during a time period (e.g., t1-t4 in FIG. 10) for which the flyback current $I_F$ flows through the semiconductor module 1, the control circuit 60 turns on the MOSFET 3 of the semiconductor module 1, thereby allowing the flyback current $I_F$ to flow through the MOSFET 3.

With the above configuration, since the flyback current $I_F$ is allowed to flow through the MOSFET 3, it is possible to minimize the surface area of the diode 5, thereby minimizing the manufacturing cost of the entire semiconductor module 1. Moreover, since the flyback current $I_F$ flows mainly through the MOSFET 3 whose on-resistance is lower than the on-resistance of the diode 5, it is possible to reduce the loss that occurs in the semiconductor module 1 during the flow of the flyback current $I_F$ through the semiconductor module 1.

[Third Embodiment]

A semiconductor module 1 according to a third embodiment has almost the same configuration as the semiconductor modules 1 according to the second embodiment. Accordingly, the differences therebetween will be mainly described hereinafter.

In the second embodiment, the surface area $S_{IGBT}$ of the IGBT 2, the surface area $S_{MOS}$ of the MOSFET 3 and the surface area $S_{DI}$ of the diode 5 are set to satisfy the relationship of $S_{IGBT} > S_{MOS} > S_{DI}$ (see FIG. 9).

Figure 13:
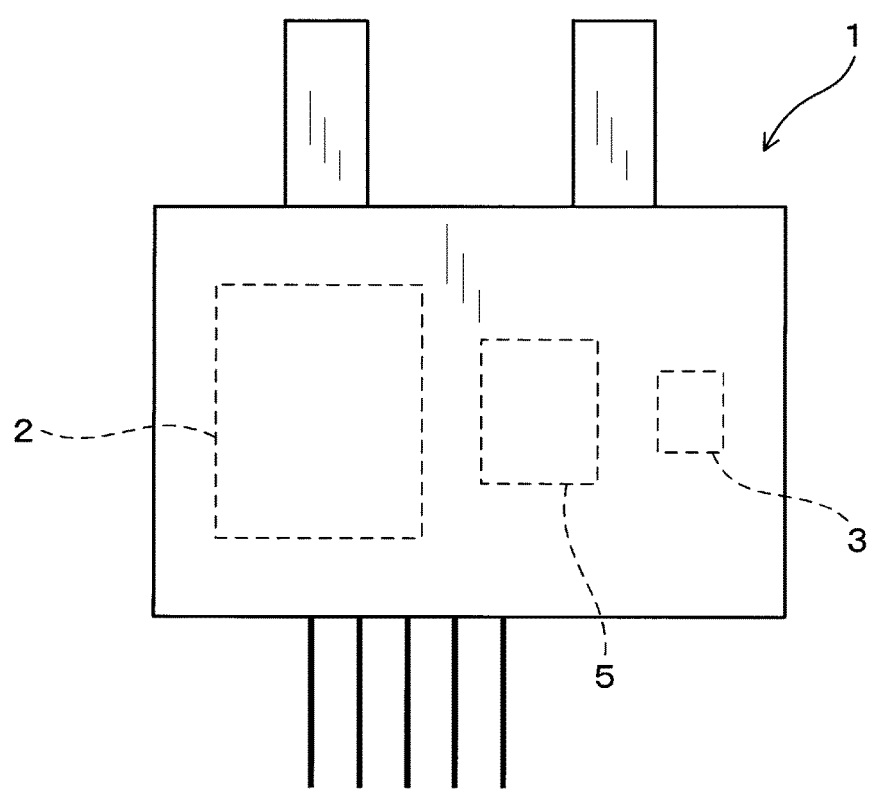
FIG 13 is a plan view of a semiconductor module according to a third embodiment, wherein an IGBT, a MOSFET and a diode, all of which are built in the semiconductor module, are shown with dashed lines.

In comparison, in the present embodiment, as shown in FIG. 13, the surface area $S_{IGBT}$ of the IGBT 2, the surface area $S_{MOS}$ of the MOSFET 3 and the surface area $S_{DI}$ of the diode 5 are set to satisfy the following relationship:

$S_{IGBT} > S_{DI} > S_{MOS}$

Moreover, in the present embodiment, the diode 5 is implemented by a Schottky barrier diode made of a wide-bandgap semiconductor (e.g., SiC) as in the second embodiment.

Similar to the electric power conversion apparatuses 6 according to the first and second embodiments (see FIG. 6), an electric power conversion apparatus 6 according to the present embodiment includes six semiconductor modules 1 ($1_H$, $1_L$) according to the present embodiment. Moreover, three of the six semiconductor modules 1 are upper-arm semiconductor modules $1_H$ while the remaining three are lower-arm semiconductor modules $1_L$. In other words, the electric power conversion apparatus 6 includes three pairs of upper-arm semiconductor modules $1_H$ and lower-arm semiconductor modules $1_L$.

Figure 15:
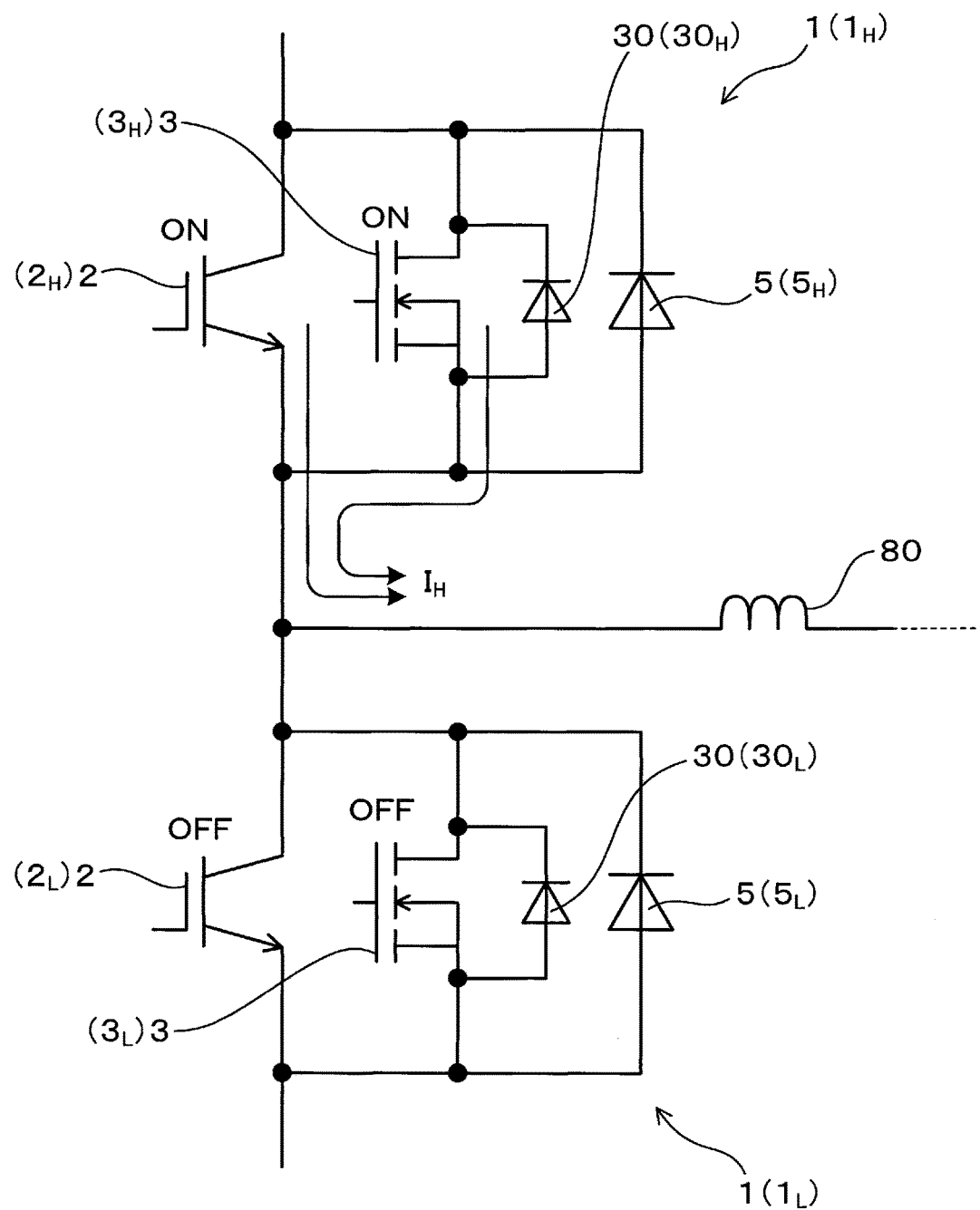
FIG. 15 is a schematic view illustrating the electric current flow in the pair of upper-arm and lower-arm semiconductor modules of the electric power conversion apparatus according to the third embodiment when both the IGBT and the MOSFET of the upper-arm semiconductor module are in an on-state.
Figure 16:
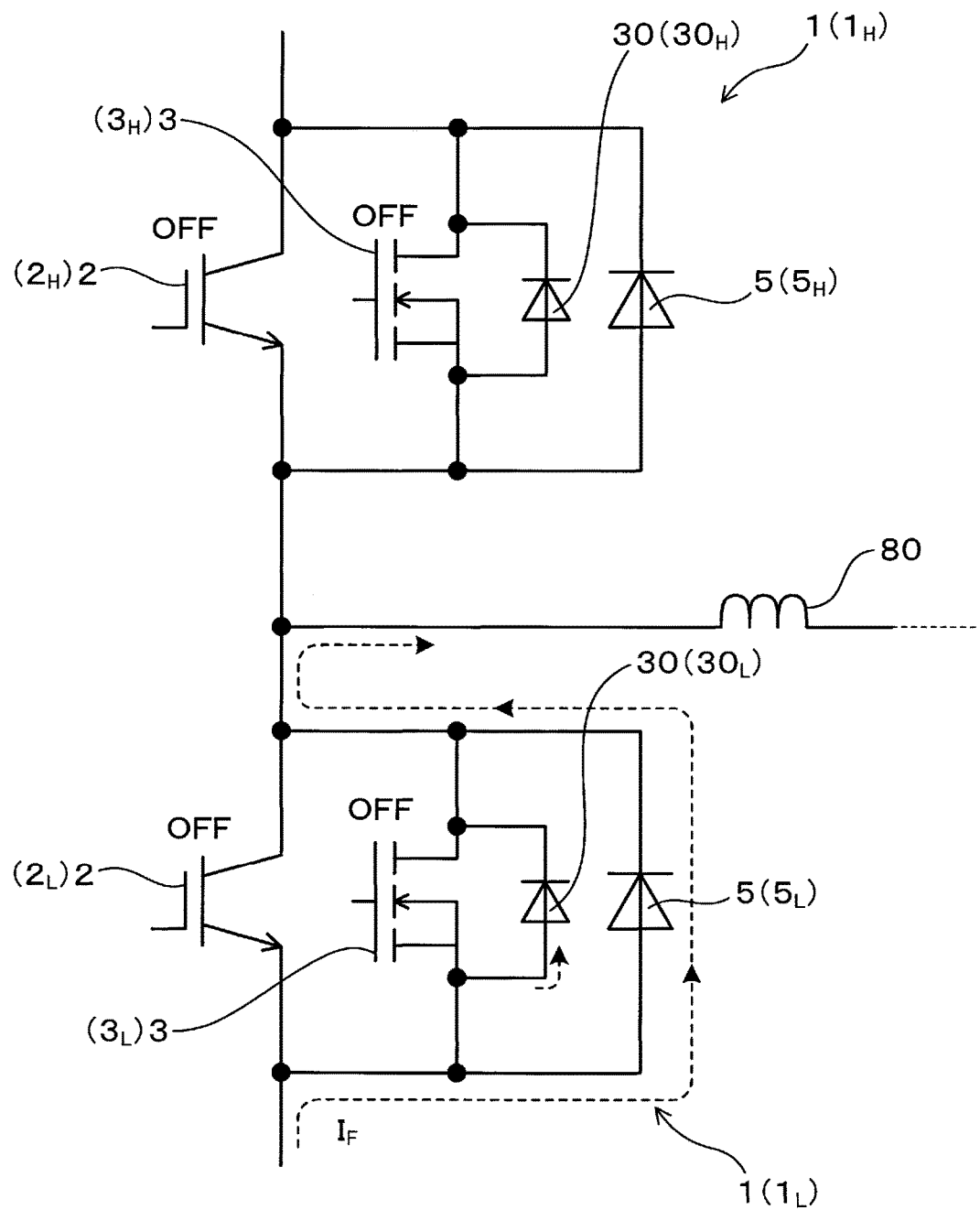
FIG. 16 is a schematic view illustrating the electric current flow in the pair of upper-arm and lower-arm semiconductor modules of the electric power conversion apparatus according to the third embodiment when both the IGBT and the MOSFET of the upper-arm semiconductor module are turned from on to off.

FIGS. 15 and 16 illustrate the electric current flow in one pair of upper-arm and lower-arm semiconductor modules $1_H$ and $1_L$ in the electric power conversion apparatus 6 according to the present embodiment.

As shown in FIG. 15, when both the IGBT $2_H$ and the MOSFET $3_H$ of the upper-arm semiconductor module $1_H$ are in an on-state, electric current $I_H$ flows through both the IGBT $2_H$ and the MOSFET $3_H$ to the AC load 80.

Then, as shown in FIG. 16, when both the IGBT $2_H$ and the MOSFET $3_H$ of the upper-arm semiconductor module $1_H$ are turned from on to off, flyback current $I_F$ generated due to the inductance of the AC load 80 flows through the diode $5_L$ of the lower-arm semiconductor module $1_L$. At the same time, a slight amount of the flyback current $I_F$ flows through the body diode $30_L$ of the MOSFET $3_L$ of the lower-arm semiconductor module $1_L$.

In the present embodiment, when the flyback current $I_F$ flows through the lower-arm semiconductor module $1_L$, the MOSFET $3_L$ of the lower-arm semiconductor module $1_L$ is kept off, thereby blocking the flyback current $I_F$ from flowing through the MOSFET $3_L$. Consequently, the flyback current $I_F$ flows mainly through the diode $5_L$ of the lower-arm semiconductor module $1_L$, not mainly through the MOSFET $3_L$ as in the second embodiment.

Figure 14:
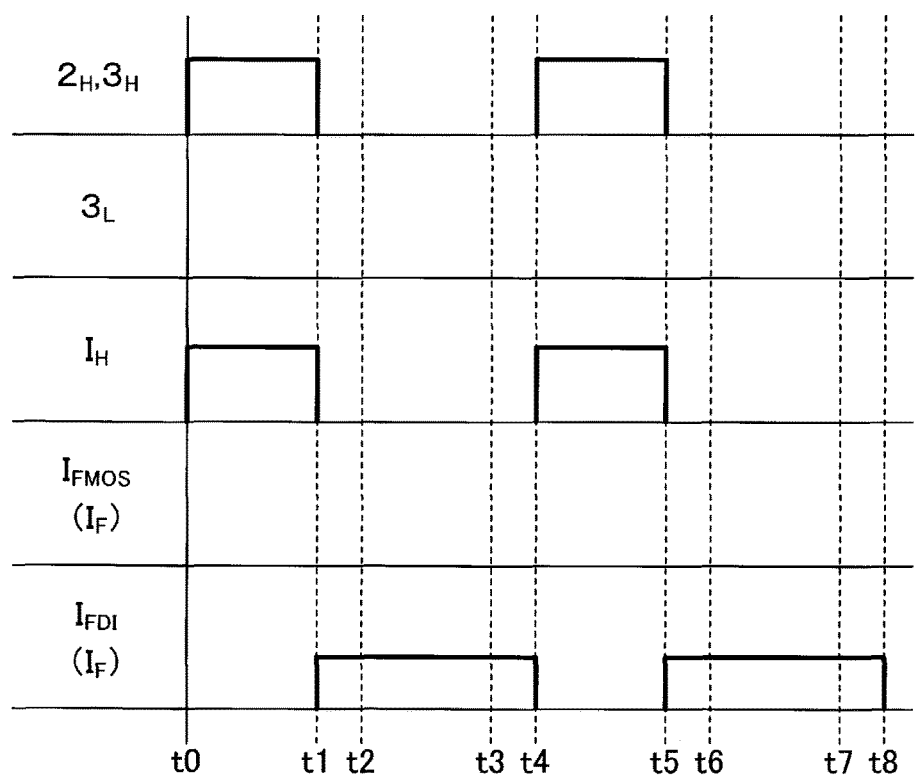
FIG 14 is a time chart illustrating the switching operation of a pair of upper-arm and lower-arm semiconductor modules of an electric power conversion apparatus according to the third embodiment.

FIG. 14 illustrates the switching operation of the pair of upper-arm and lower-arm semiconductor modules $1_H$ and $1_L$ according to the present embodiment.

As shown in FIG. 14, both the IGBT $2_H$ and the MOSFET $3_H$ of the upper-arm semiconductor module $1_H$ are turned on at a time instant t0 and kept on until a time instant t1. During the duration of t0-t1, the electric current $I_H$ flows through both the IGBT $2_H$ and the MOSFET $3_H$ to the AC load 80. Then, at the time instant t1, both the IGBT $2_H$ and the MOSFET $3_H$ of the upper-arm semiconductor module $1_H$ are turned from on to off and kept off until a time instant t4. During the duration of t1-t4, the MOSFET $3_L$ of the lower-arm semiconductor module $1_L$ is kept off so that the flyback current $I_F$ flows mainly through the diode $5_L$ of the lower-arm semiconductor module $1_L$. At the time instant t4, both the IGBT $2_H$ and the MOSFET $3_H$ of the upper-arm semiconductor module $1_H$ are again turned on and kept on until they are again turned off at a time instant t5. During the duration of t4-t5, the electric current $I_H$ flows through both the IGBT $2_H$ and the MOSFET $3_H$ to the AC load 80. In the above manner, the switching operation of the pair of upper-arm and lower-arm semiconductor modules $1_H$ and $1_L$ is repeated. In addition, the switching operation is controlled by a control circuit 60 of the electric power conversion apparatus 6 (see FIG. 6).

According to the present embodiment, it is possible to achieve the same advantageous effects as described in the first embodiment.

Moreover, in the present embodiment, each semiconductor module 1 further includes, in addition to the IGBT 2 and the MOSFET 3, the diode 5 that is connected in antiparallel to the MOSFET 3. Consequently, it is possible to for an increased amount of the flyback current $I_F$ to flow through the semiconductor module 1 without incurring a large loss.

In the present embodiment, the diode 5 is implemented by a Schottky barrier diode made of a wide-bandgap semiconductor. In a Schottky barrier diode, there is no recovery current flowing. Therefore, implementing the diode 5 with a Schottky barrier diode, it is possible to eliminate the recovery loss of the diode 5.

In the present embodiment, the surface area $S_{IGBT}$ of the IGBT 2, the surface area $S_{MOS}$ of the MOSFET 3 and the surface area $S_{DI}$ of the diode 5 are set to satisfy the relationship of $S_{IGBT} > S_{DI} > S_{MOS}$. Therefore, it is possible to minimize the surface area of the MOSFET 3 that is made of the wide-bandgap semiconductor whose manufacturing cost is high. Consequently, it is possible to minimize the manufacturing cost of the entire semiconductor module 1.

In the present embodiment, over a time period (e.g., t1-t4 in FIG. 14) for which the flyback current $I_F$ flows through the semiconductor module 1, the control circuit 60 keeps the MOSFET 3 of the semiconductor module 1 off, thereby blocking the flyback current $I_F$ from flowing through the MOSFET 3.

With the above configuration, since the flyback current $I_F$ does not flow through the MOSFET 3, it is easy to minimize the surface area of the MOSFET 3 and thus easy to minimize the manufacturing cost of the entire semiconductor module 1. In addition, as described above, in the present embodiment, the surface area $S_{DI}$ of the diode 5 is specified to be greater than the surface area $S_{MOS}$ of the MOSFET 3. Therefore, it is possible to lower the on-resistance of the diode 5, thereby allowing an increased amount of the flyback current $I_F$ to flow through the diode 5. Consequently, though the MOSFET 3 is kept off, it is still for a sufficient amount of the flyback current $I_F$ to flow through the semiconductor module 1 without incurring a large loss.

While the above particular embodiments have been shown and described, it will be understood by those skilled in the art that the present invention can also be embodied in various other modes without departing from the spirit of the present invention.

What is claimed is:

1. An electric power conversion apparatus comprising:
an IGBT made of a silicon semiconductor; and
a MOSFET made of a wide-bandgap semiconductor having a wider bandgap than the silicon semiconductor,
wherein
the IGBT and the MOSFET are connected in parallel to each other to form a semiconductor element pair,
a surface area of the IGBT is greater than a surface area of the MOSFET,
in a low-temperature state in which temperature of the semiconductor element pair is lower than in a high-temperature state, on-resistance of the MOSFET is lower than on-resistance of the IGBT at a given electric current, and
in the high-temperature state in which the temperature of the semiconductor element pair is higher than in the low-temperature state, the on-resistance of the IGBT is lower than the on-resistance of the MOSFET at the given electric current.

2. The electric power conversion apparatus module as set forth in claim 1, further comprising a diode that is connected in antiparallel to the MOSFET.

3. The electric power conversion apparatus as set forth in claim 2, wherein the diode is a Schottky barrier diode made of a wide-bandgap semiconductor.

4. The electric power conversion apparatus as set forth in claim 2, wherein the following relationship is satisfied:

$$S_{IGBT} > S_{MOS} > S_{DI},$$

where $S_{IGBT}$ is the surface area of the IGBT, $S_{MOS}$ is the surface area of the MOSFET, and $S_{DI}$ is a surface area of the diode.

5. The electric power conversion apparatus as set forth in claim 2, wherein the following relationship is satisfied:

$$S_{IGBT} > S_{DI} > S_{MOS},$$

where $S_{IGBT}$ is the surface area of the IGBT, $S_{DI}$ is a surface area of the diode, and $S_{mos}$ is the surface area of the MOSFET.

6. The electric power conversion apparatus as set forth in claim 2, further comprising:
a control circuit configured to control operation of the semiconductor element pair,
wherein during a time period for which flyback current flows through the semiconductor element pair, the control circuit turns on the MOSFET, thereby allowing the flyback current to flow through the MOSFET.

7. The electric power conversion apparatus as set forth in claim 2, further comprising:
a control circuit configured to control operation of the semiconductor element pair,
wherein over a time period for which flyback current flows through the semiconductor element pair, the control circuit keeps the MOSFET off, thereby blocking the flyback current from flowing through the MOSFET.

* * * * *